US010181532B2

(12) United States Patent
Das et al.

(10) Patent No.: US 10,181,532 B2
(45) Date of Patent: Jan. 15, 2019

(54) LOW LOSS ELECTRONIC DEVICES HAVING INCREASED DOPING FOR REDUCED RESISTANCE AND METHODS OF FORMING THE SAME

(71) Applicant: Cree, Inc., Durham, NC (US)

(72) Inventors: Mrinal Kanti Das, Durham, NC (US); Doyle Craig Capell, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 801 days.

(21) Appl. No.: 13/835,342

(22) Filed: Mar. 15, 2013

(65) Prior Publication Data

US 2014/0266403 A1 Sep. 18, 2014

(51) Int. Cl.
*H01L 29/872* (2006.01)
*H01L 29/16* (2006.01)
*H01L 29/86* (2006.01)
*H01L 29/861* (2006.01)

(52) U.S. Cl.
CPC ........ *H01L 29/872* (2013.01); *H01L 29/1608* (2013.01); *H01L 29/8611* (2013.01)

(58) Field of Classification Search
CPC .............................. H01L 29/06; H01L 29/161
USPC ........... 257/76, 77, 471–475, 296, 368, 392, 257/E21.209, E21.298, E29.32, E27.08; 438/588, 283
See application file for complete search history.

(56) References Cited

U.S. PATENT DOCUMENTS

| | | | |
|---|---|---|---|
| 2005/0167697 A1* | 8/2005 | Flynn | C30B 25/02 257/194 |
| 2006/0076625 A1* | 4/2006 | Lee et al. | 257/353 |
| 2006/0237813 A1* | 10/2006 | Hshieh et al. | 257/475 |
| 2006/0255423 A1* | 11/2006 | Ryu | H01L 29/872 257/485 |
| 2008/0073635 A1* | 3/2008 | Kiyotoshi et al. | 257/2 |
| 2008/0090362 A1* | 4/2008 | Kim et al. | 438/283 |
| 2008/0135970 A1* | 6/2008 | Kim | H01L 29/402 257/471 |
| 2009/0289262 A1* | 11/2009 | Zhang | H01L 29/0615 257/77 |
| 2010/0133549 A1* | 6/2010 | Zhang | H01L 29/0619 257/77 |
| 2010/0240205 A1* | 9/2010 | Son et al. | 438/588 |
| 2010/0259311 A1* | 10/2010 | Yang et al. | 327/333 |
| 2010/0271852 A1* | 10/2010 | Nakamura | 363/131 |
| 2010/0289032 A1* | 11/2010 | Zhang | H01L 21/0465 257/77 |
| 2010/0301351 A1* | 12/2010 | Flynn | C30B 25/02 257/77 |
| 2010/0308337 A1* | 12/2010 | Sriram | H01L 29/267 257/73 |
| 2011/0169549 A1* | 7/2011 | Wu | 327/434 |
| 2011/0215338 A1* | 9/2011 | Zhang | H01L 29/1608 257/73 |
| 2012/0205666 A1* | 8/2012 | Henning | H01L 29/0615 257/77 |

(Continued)

*Primary Examiner* — Sheikh Maruf
(74) *Attorney, Agent, or Firm* — Myers Bigel, P.A.

(57) ABSTRACT

An electronic device includes a drift region having a first conductivity type and a grid including a plurality of doped regions formed in the drift region and having a second conductivity type. The doped regions have a dopant concentration greater than $2.2 \times 10^{19}$ cm$^{-3}$. Related methods are also disclosed.

24 Claims, 6 Drawing Sheets

(56) References Cited

U.S. PATENT DOCUMENTS

| | | | |
|---|---|---|---|
| 2012/0223333 A1* | 9/2012 | Mizukami | 257/77 |
| 2012/0256192 A1* | 10/2012 | Zhang | H01L 29/0619 257/77 |
| 2013/0032809 A1* | 2/2013 | Allen | H01L 29/47 257/73 |
| 2013/0105819 A1* | 5/2013 | Kameshiro et al. | 257/77 |
| 2013/0140585 A1* | 6/2013 | Mazzola | H01L 29/872 257/77 |

* cited by examiner

| Dose | Energy |
|---|---|
| 6E13 cm-2 | 30 keV |
| 1.6E14cm-2 | 80 keV |
| 3.2E14cm-2 | 180 keV |

FIG. 4
(Related Art)

| Dose | Energy |
|---|---|
| 3.0E13 cm-2 | 30 keV |
| 7.0E14cm-2 | 80 keV |
| 6.0E14cm-2 | 180 keV |
| 4.5E14cm-2 | 360 keV |

LOW LOSS ELECTRONIC DEVICES HAVING INCREASED DOPING FOR REDUCED RESISTANCE AND METHODS OF FORMING THE SAME

FIELD

The present invention relates to microelectronic devices, and more particularly to microelectronic power devices.

BACKGROUND

High voltage silicon carbide (SiC) devices can be capable of handling high voltages, and may handle as much as about 100 amps or more of current, depending on the size of their active area. High voltage SiC devices have a number of important applications, particularly in the field of power conditioning, distribution and control.

High voltage silicon carbide (SiC) Schottky diodes, which may have voltage blocking ratings between, for example, about 600V and about 2.5 kV, are expected to compete with silicon PIN diodes having similar voltage ratings. Such diodes may handle as much as about 100 amps or more of forward current, depending on their active area design. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based Schottky devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n− epitaxial layer, which functions as a drift region, is formed. The device typically includes a Schottky contact formed directly on the n− layer. A junction termination region, such as a guard ring and/or p-type JTE (junction termination extension) region, is typically formed to surround the Schottky junction active region. The purpose of junction termination region is to reduce or prevent electric field crowding at the edges of the Schottky junction, and to reduce or prevent the depletion region from interacting with the surface of the device. Surface effects may cause the depletion region to spread unevenly, which may adversely affect the breakdown voltage of the device. Other termination techniques include field plates and floating field rings that may be more strongly influenced by surface effects. A channel stop region may also be formed by implantation of n-type dopants in order to prevent the depletion region from extending to the edge of the device.

Figure 1:
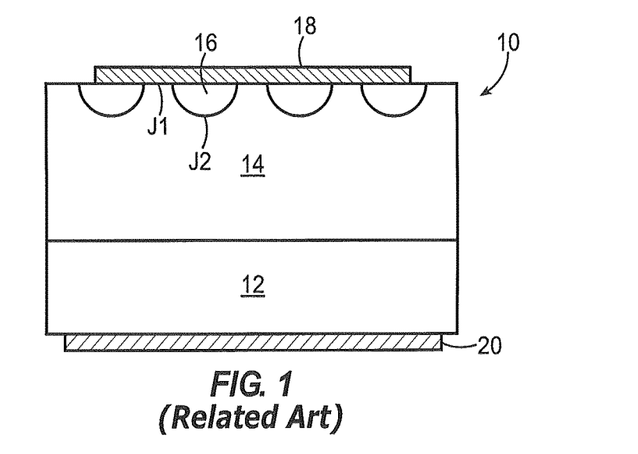
FIG. 1 is a cross-sectional view of a conventional JBS diode.

Regardless of the type of termination used, the Schottky diode will fail if a large enough reverse voltage is applied to the junction. Such failures are generally catastrophic, and may damage or destroy the device. Furthermore, even before the junction has failed, a Schottky diode may experience large reverse leakage currents. In order to reduce such leakage currents, the junction barrier Schottky (JBS) diode was developed. JBS diodes are sometimes referred to as Merged PIN—Schottky (MPS) diodes. A conventional JBS diode 10 is illustrated in FIG. 1. As shown therein, a conventional JBS diode includes an n-type substrate 12 on which an n− drift layer 14 is formed. A plurality of p+ regions 16 are formed, typically by ion implantation, in the surface of the n− drift layer 14. A metal anode contact 18 is formed on the surface of the n− drift layer 14 in contact with both the n− drift layer 14 and the p+ regions 16. The anode contact 18 forms a Schottky junction with the exposed portions of the drift layer 14, and may form an ohmic contact with the p+ regions 16. A cathode contact 20 is formed on the substrate 12. Silicon carbide-based JBS diodes are described, for example, in U.S. Pat. Nos. 6,104,043 and 6,524,900.

In forward operation, the junction J1 between the anode contact 18 and the drift layer 14 turns on before the junction J2 between the p+ regions 16 and the drift layer 14. Thus, at low forward voltages, the device exhibits Schottky diode behavior. That is, current transport in the device is dominated by majority carriers (electrons) injected across the Schottky junction J1 at low forward voltages. As there may be no minority carrier injection (and thus no minority charge storage) in the device at normal operating voltages, JBS diodes have fast switching speeds characteristic of Schottky diodes.

Under reverse bias conditions, however, the depletion regions formed by the PN junctions J2 between the p+ regions 16 and the drift layer 14 expand to block reverse current through the device 10, protecting the Schottky junction J1 and limiting reverse leakage current in the device 10. Thus, in reverse bias, the JBS diode 10 behaves like a PIN diode. The voltage blocking ability of the device 10 is typically determined by the thickness and doping of the drift layer 14 and the design of the edge termination.

SUMMARY

Some embodiments of the present inventive subject matter provide an electronic device that includes a drift region having a first conductivity type and a grid comprising a plurality of doped regions formed in the drift region and having a second conductivity type. The doped regions have a dopant concentration greater than $2.2 \times 10^{19}$ cm$^{-3}$.

In other embodiments, the doped regions have a dopant concentration of at least $3.0 \times 10^{19}$ cm$^{-3}$.

In still other embodiments, the doped regions have a dopant concentration of at least $4.0 \times 10^{19}$ cm$^{-3}$.

In still other embodiments, the doped regions have a dopant concentration of at least $7.0 \times 10^{19}$ cm$^{-3}$.

In still other embodiments, the doped regions have a dopant concentration of at least $8.0 \times 10^{19}$ cm$^{-3}$.

In still other embodiments, the doped regions have a dopant concentration between $2.5 \times 10^{19}$ cm$^{-3}$ and $9.0 \times 10^{19}$ cm$^{-3}$.

In still other embodiments, the doped regions have a dopant concentration between $4.0 \times 10^{19}$ cm$^{-3}$ and $9.0 \times 10^{19}$ cm$^{-3}$.

In still other embodiments, the doped regions have a dopant concentration between $6.0 \times 10^{19}$ cm$^{-3}$ and $9.0 \times 10^{19}$ cm$^{-3}$.

In still other embodiments, the first conductivity type is n-type and the second conductivity type is p-type.

In still other embodiments, the drift region comprises a SiC layer.

In still other embodiments, the electronic device further comprises a contact on the drift region that forms a Schottky junction with the drift region.

In still other embodiments, the electronic device further comprises a metal layer on the contact.

In still other embodiments, the metal layer is Ti and/or TiW.

In still other embodiments, the dopant comprises aluminum ions.

In still other embodiments, the electronic device is a junction barrier Schottky (JBS) diode.

In further embodiments of the inventive subject matter, an electronic device is formed by providing a drift region having a first conductivity type and forming a plurality of doped regions in the drift region having a second conductivity type and having a dopant concentration greater than $2.2 \times 10^{19}$ cm$^{-3}$.

In still further embodiments, forming the plurality of doped regions comprises forming the plurality of doped regions having a dopant concentration of at least $3.0 \times 10^{19}$ cm$^{-3}$.

In still further embodiments, forming the plurality of doped regions comprises forming the plurality of doped regions having a dopant concentration of at least $4.0 \times 10^{19}$ cm$^{-3}$.

In still further embodiments, forming the plurality of doped regions comprises forming the plurality of doped regions having a dopant concentration of at least $7.0 \times 10^{19}$ cm$^{-3}$.

In still further embodiments, forming the plurality of doped regions comprises forming the plurality of doped regions having a dopant concentration of at least $8.0 \times 10^{19}$ cm$^{-3}$.

In still further embodiments, forming the plurality of doped regions comprises forming the plurality of doped regions having a dopant concentration between $2.5 \times 10^{19}$ cm$^{-3}$ and $9.0 \times 10^{19}$ cm$^{-3}$.

In still further embodiments, forming the plurality of doped regions comprises forming the plurality of doped regions having a dopant concentration between $4.0 \times 10^{19}$ cm$^{-3}$ and $9.0 \times 10^{19}$ cm$^{-3}$.

In still further embodiments, forming the plurality of doped regions comprises forming the plurality of doped regions having a dopant concentration between $6.0 \times 10^{19}$ cm$^{-3}$ and $9.0 \times 10^{19}$ cm$^{-3}$.

In still further embodiments, the method further comprises forming a contact on the drift region that forms a Schottky junction with the drift region.

In still further embodiments, the method further comprises forming a metal layer on the contact.

In still further embodiments, the metal layer is Ti and/or TiW.

In still further embodiments, forming the doped regions comprises implanting the dopant at a dose of about $3.0 \times 10^{13}$ cm$^{-2}$ at an energy level of about 30 keV, implanting the dopant at a dose of about $7.0 \times 10^{14}$ cm$^{-2}$ at an energy level of about 80 keV, implanting the dopant at a dose of about $6.0 \times 10^{14}$ cm$^{-2}$ at an energy level of about 180 keV, and implanting the dopant at a dose of about $4.5 \times 10^{14}$ cm$^{-2}$ at an energy level of about 360 keV.

In still other embodiments of the inventive subject matter, an electronic device is configured to switch a voltage between 6000 volts and 8000 volts and has a switching loss less than 450 µJ.

In still other embodiments, the electronic device is configured to switch the voltage between 6500 volts and 7500 volts and has a switching loss less than 400 µJ.

In still other embodiments, the electronic device is configured to switch the voltage between 6000 volts and 7000 volts and has a switching loss less than 300 µJ.

In still other embodiments, the electronic device is a junction barrier Schottky (JBS) diode and the switching loss is not associated with diode junction capacitance.

In still other embodiments, the voltage is switched at a rate of approximately 150 kV/µsec.

In still further embodiments of the inventive subject matter, an electronic device is configured to switch a voltage between 6000 volts and 8000 volts and has a charge loss less than 120 nC.

In still further embodiments, the electronic device is configured to switch the voltage between 6500 volts and 8000 volts and has a charge loss less than 160 nC.

In still further embodiments, the electronic device is configured to switch the voltage between 7000 volts and 8000 volts and has a charge loss less than 230 nC.

In still further embodiments, the electronic device is a junction barrier Schottky (JBS) diode and the charge loss is not associated with diode junction capacitance.

In still further embodiments, the voltage is switched at a rate of approximately 150 kV/µsec.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the detailed description.

Figure 2:
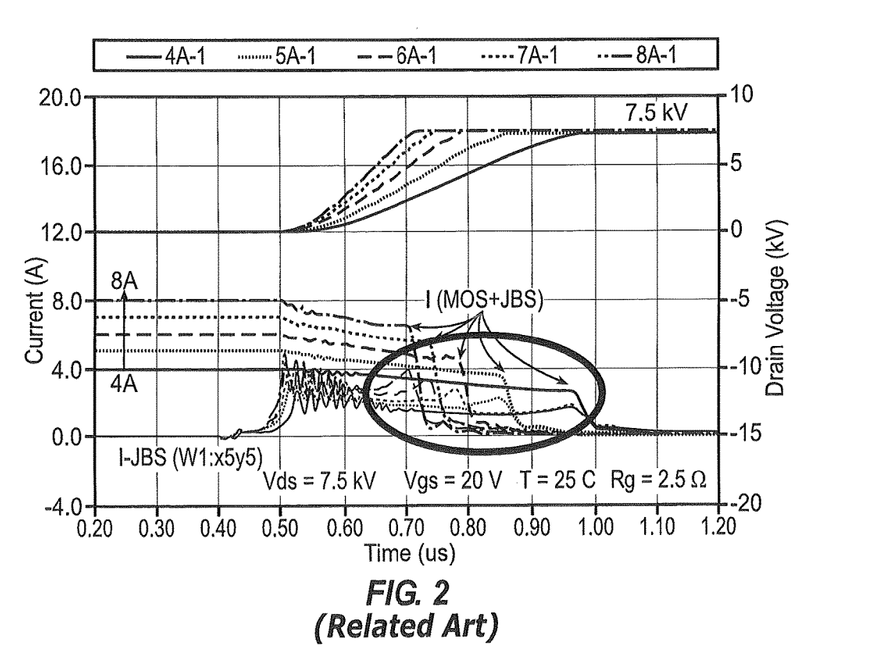
FIG. 2 is a graph of current versus time at the end of the turn-off transient for a conventional JBS diode.

As SiC power devices are included in more applications, the ability to maintain relatively low loss switching during high dV/dt transitions may become more important. This issue may be especially important for high voltage unipolar devices, such as a 10 kV SiC MOSFET and JBS diode, where voltages between 5 kV and 10 kV, for example, may need to be switched in 100 nsec or less. As shown in FIG. 2, a conventional 10 kV SiC JBS diode shows an increase in the current versus time waveform at the end of the turn-off transient. This may be problematic because high current and high voltage are occurring simultaneously thereby generating significant power switching losses. The current may increase due to a stray resistance in the P+ grid/guard ring resulting in an RC time constant limitation of the dV/dt.

Embodiments of the present inventive subject matter may provide improved switching performance in semiconductors, such as a JBS diode, PIN device, MPS device, or other semiconductor devices, by increasing the dopant concentration in the grid of a JBS diode formed in a drift layer, for example, to reduce the resistance of the grid. The reduction in resistance may be beneficial in high power devices operating at voltages of 3 kV or higher, for example, that generate high dV/dt induced displacement current. By reducing the resistance, power losses in hard-switched applications, for example, may be reduced. For additional reduction in resistance, a contact metallization layer for the device may be formed of metals, such as titanium, tungsten, tantalum and/or combinations and compounds thereof.

Figure 3:
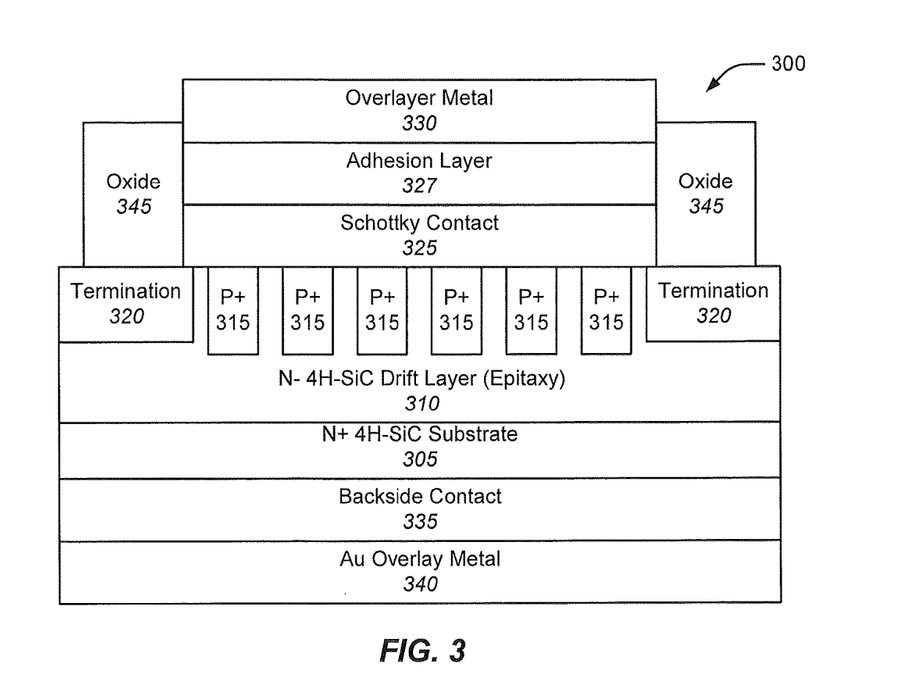
FIG. 3 is a cross-sectional view of a JBS diode according to some embodiments of the inventive subject matter.

FIG. 3 illustrates a JBS diode 300 according to some embodiments of the inventive subject matter. The JBS diode 300 includes an N+ type substrate 305 on which an N− drift layer 310 is formed. A plurality of P+ regions 315 are formed, typically by ion implantation, in the surface of the N− drift layer 310. Termination regions 320 are formed in the N− drift layer 310 surrounding the P+ regions 315. A metal anode contact 325 is formed on the surface of the N− drift layer 310 in contact with both the N− drift layer 310 and the P+ regions 315. The anode contact 325 forms a Schottky junction with the exposed portions of the N-drift layer 310, and may form an ohmic contact with the P+ regions 315. The anode contact 325 may comprise Ni. An adhesion layer 327 may be formed on the anode contact 325 and may comprise Ti. An overlayer metal 330 may be formed on the adhesion layer 327 and may comprise Ta, Ti, and/or TiW. A cathode contact may be formed on the backside of the substrate 305, which may include a backside contact 335 and an Au layer 340. An insulating oxide layer 345 may be formed adjacent the Schottky contact 325 on the N− drift layer 310.

Conventional P+ grid/guard ring designs use P+ regions or islands that are designed to optimize the tradeoff between blocking and on-resistance. When compared to a pure Schottky barrier diode (SBD), a JBS diode has better blocking due to the reduction of the surface electric fields, but lower conduction because of the reduced Schottky contact area to the conducting part of the SiC surface. As described above, during the turn off transient, a displacement current, which arises from the product of the junction capacitance and dV/dt, flows through the p-type contact for proper commutation. With higher voltage unipolar devices, dV/dt becomes large, thereby creating large displacement currents. Conventional technologies prevalent at lower voltages have modest dV/dt characteristics, which produces manageable displacement current that a conventional device structure can handle without significant power losses. At higher voltages, such as 3 kV and above, the dV/dt induced displacement current can be an order of magnitude higher. To reduce the power losses during hard-switched applications, for example, the resistance of the JBS grid comprising the P+ regions 315 can be reduced by increasing the p-type dopant concentration.

Figure 4:
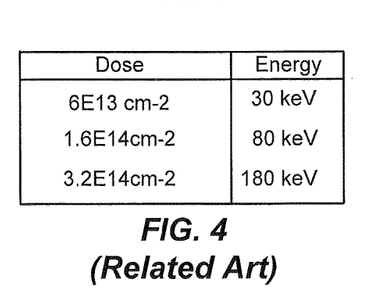
FIG. 4 is a table of an implant schedule for a conventional JBS diode.
Figure 5:
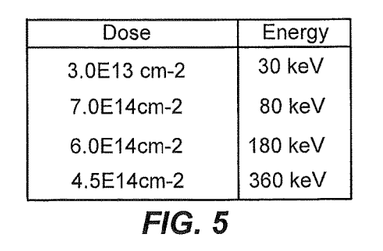
FIG. 5 is a table of an implant schedule for a JBS diode according to some embodiments of the inventive subject matter.
Figure 6:
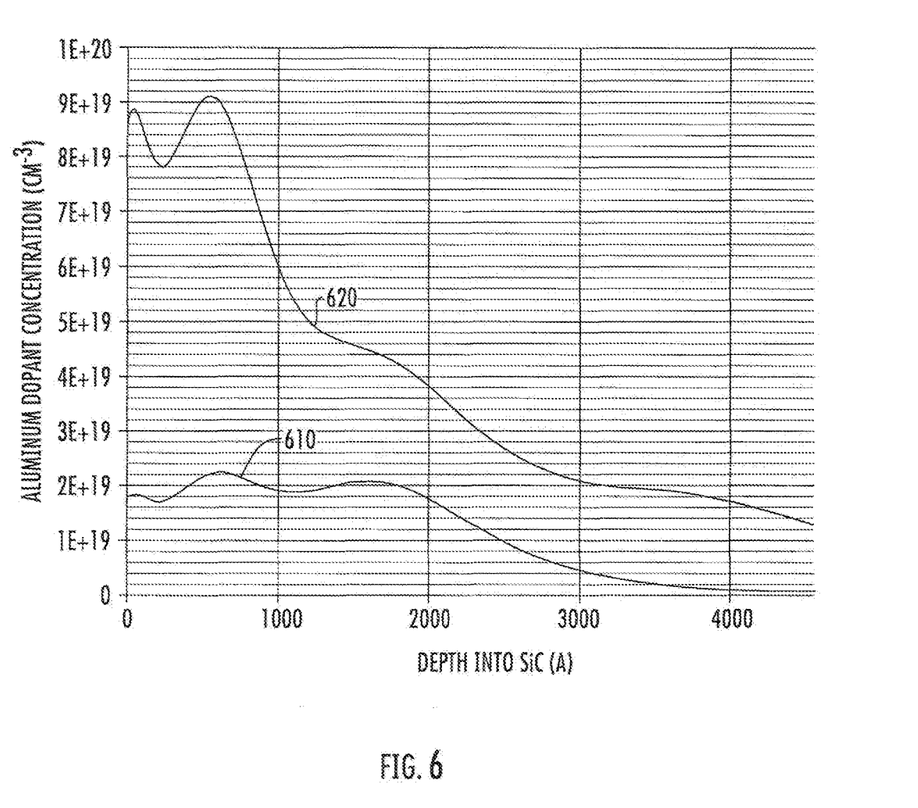
FIG. 6 is a graph of a doping profile for a JBS diode according to some embodiments of the inventive subject matter.
Figure 7:
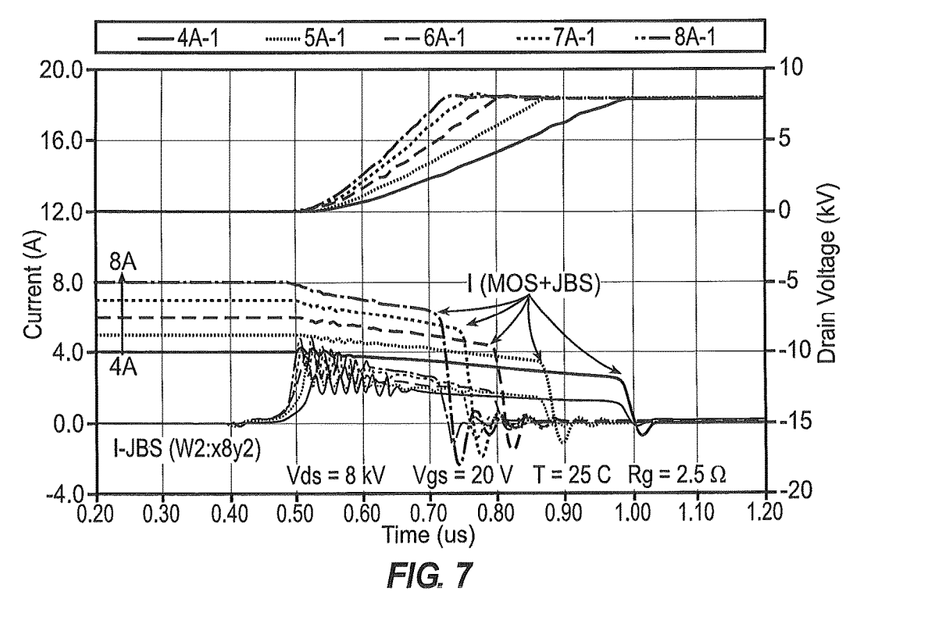
FIG. 7 is a graph of current versus time at the end of the turn-off transient for a JBS diode according to some embodiments of the inventive subject matter.

Referring now to FIGS. 4-6, the table in FIG. 4 shows an implant schedule of Al dopants for the P+ regions in a conventional JBS grid including approximate dosage and associated energy levels. Such a schedule results in a doping profile 610 as shown in FIG. 6 where the peak dopant concentration is approximately $2.2 \times 10^{19}$ cm$^{-3}$. FIG. 5 shows an implant schedule for the P+ regions 315 in a JBS grid according to some embodiments of the present inventive subject matter including approximate dosage and associated energy levels. Such a schedule results in a doping profile 620 as shown in FIG. 6 where the peak dopant concentration is approximately $9.1 \times 10^{19}$ cm$^{-3}$. As shown in FIG. 6, the peak dopant concentration in the P+ regions 315 is approximately four times as great or more at a depth into the N− drift layer 310 of approximately 800 Å. Moreover, the dopant concentration according to embodiments of the present inventive subject matter does not fall below approximately $2.0 \times 10^{19}$ cm$^{-3}$ until reaching a depth of approximately 3000 Å. In general, an upper limit on the increased dopant in the P+ regions 315 is about the point where hole injection occurs in the device.

To provide additional reduction in resistance to further reduce power losses, a different metal may be used for the overlayer metal layer 330. According to various embodiments of the inventive subject matter, the contact metallization layer 330 may comprise titanium, tungsten, tantalum and/or combinations and compounds thereof.

Embodiments of the present inventive subject matter may reduce the resistance of the grid in a JBS diode by increasing the dopant concentration. For additional reduction in resistance, the contact metallization layer may be formed of metals, such as titanium and/or tantalum. The reduction in resistance may particularly beneficial in high power devices operating at voltages of 3 kV or higher, for example, that generate high dV/dt induced displacement current. The increased current may result in significant power losses in hard-switched applications; therefore, by reducing the resistance of the grid in the JBS diode power loss can likewise be reduced.

Figure 8:
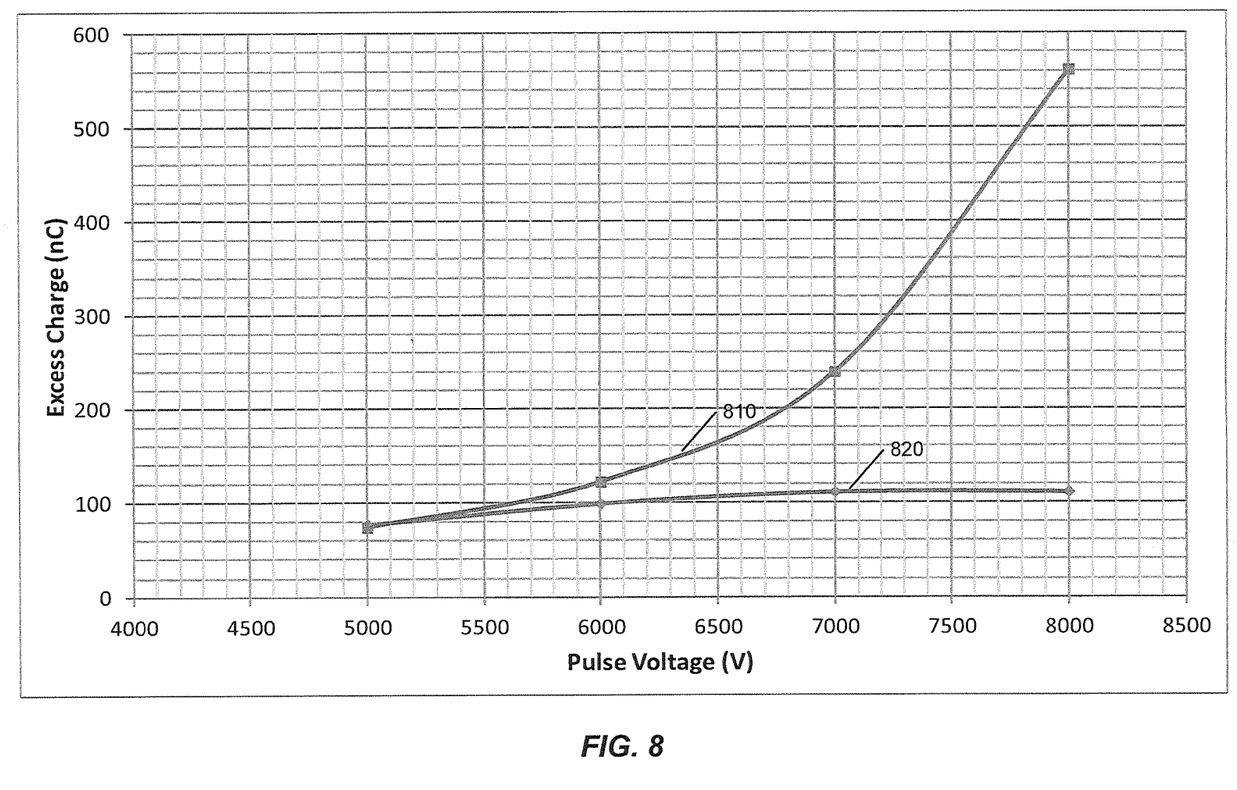
FIGS. 8 and 9 are graphs that illustrate operations of an electronic device or circuit that includes a JBS diode with increased dopant concentration according to some embodiments of the inventive subject matter.
Figure 9:
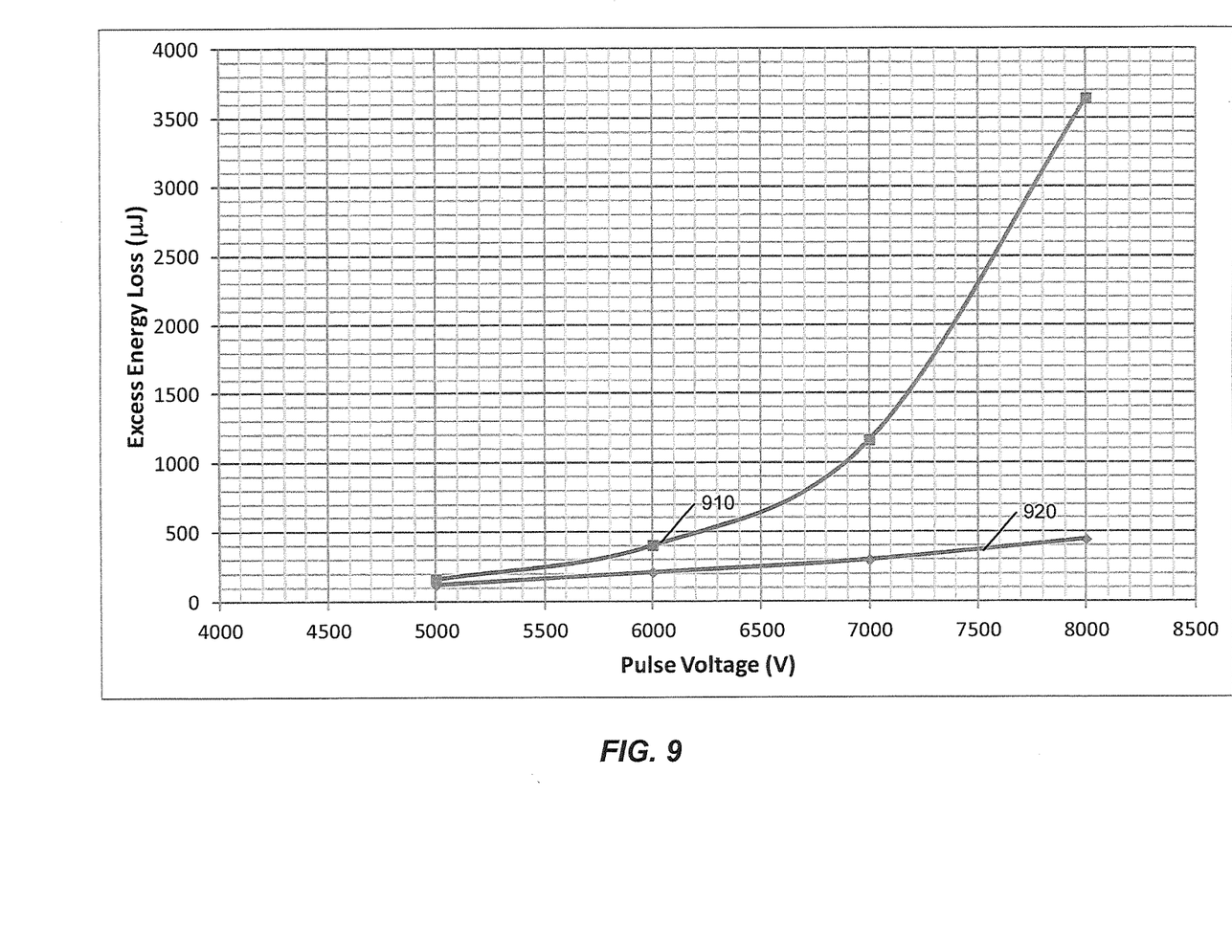

FIGS. 8 and 9 are graphs that illustrate operations of an electronic device or circuit that includes a JBS diode with increased dopant concentration according to some embodiments of the inventive subject matter. In particular, FIG. 8 is a graph that illustrates charge loss versus pulse voltage for a JBS diode according to some embodiments of the inventive subject matter and a conventional JBS diode and FIG. 9 is a graph that illustrates switching loss versus pulse voltage for a JBS diode according to some embodiments of the inventive subject matter and a conventional JBS diode. The test environment for generating the graphs shown in FIGS. 8 in 9 included a voltage source that generated voltage pulses at a frequency of 350 Hz, which were applied to a 200 ohm resistor and diode under test, which were connected in series. The change in voltage per unit of time (dV/dt) was 150 kV/μsec. The charge losses and switching losses illustrated in FIGS. 8 and 9, respectively, are losses not associated with the diode junction capacitance, which is an intrinsic loss mechanism.

Referring now to FIG. 8 and the table below, the charge loss for the conventional diode 810 begins to deviate sharply from the charge loss for the JBS diode according to some embodiments of the inventive subject matter 820 for pulse voltages greater than 6 kV. The charge loss for the conventional diode is more than twice that of the charge loss for the JBS diode 820 at voltage levels at least 7 kV.

| Pulse Voltage | Conventional Diode (810) charge loss nC | JBS diode (820) charge loss nC |
|---|---|---|
| 5 kV | 74 | 77 |
| 6 kV | 122 | 99 |
| 7 kV | 239 | 111 |
| 8 kV | 561 | 111 |

Referring now to FIG. 9 and the table below, the switching loss for the conventional diode 910 begins to deviate sharply from the switching loss for the JBS diode according to some embodiments of the inventive subject matter 920 for pulse voltages greater than 6 kV. The switching loss for the conventional diode is more than three times that of the switching loss for the JBS diode 920 at voltage levels at least 7 kV.

| Pulse Voltage | Conventional Diode (910) switching loss µJ | JBS diode (920) switching loss µJ |
|---|---|---|
| 5 kV | 163 | 122 |
| 6 kV | 405 | 211 |
| 7 kV | 1161 | 299 |
| 8 kV | 3640 | 445 |

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to herein as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention have been described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention have been described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electronic device, comprising:
a drift region having a first conductivity type; and
a grid comprising a plurality of doped regions formed in the drift region and having a second conductivity type;
wherein the doped regions have a dopant concentration of at least $2.0 \times 10^{19}$ cm$^{-3}$ to a depth of 3000 Å; and
wherein the dopant comprises aluminum ions.

2. The electronic device of claim 1, wherein the doped regions have a dopant concentration of at least $3.0 \times 10^{19}$ cm$^{-3}$.

3. The electronic device of claim 1, wherein the doped regions have a dopant concentration of at least $4.0 \times 10^{19}$ cm$^{-3}$.

4. The electronic device of claim 1, wherein the doped regions have a dopant concentration of at least $7.0 \times 10^{19}$ cm$^{-3}$.

5. The electronic device of claim 1, wherein the doped regions have a dopant concentration of at least $8.0 \times 10^{19}$ cm$^{-3}$.

6. The electronic device of claim 1, wherein the doped regions have a dopant concentration between $2.5 \times 10^{19}$ cm$^{-3}$ and $9.0 \times 10^{19}$ cm$^{-3}$.

7. The electronic device of claim 1, wherein the doped regions have a dopant concentration between $4.0 \times 10^{19}$ cm$^{-3}$ and $9.0 \times 10^{19}$ cm$^{-3}$.

8. The electronic device of claim 1, wherein the doped regions have a dopant concentration between $6.0 \times 10^{19}$ cm$^{-3}$ and $9.0 \times 10^{19}$ cm$^{-3}$.

9. The electronic device of claim 1, wherein the first conductivity type is n-type and the second conductivity type is p-type.

10. The electronic device of claim 1, wherein the drift region comprises a SiC layer.

11. The electronic device of claim 1, further comprising a contact on the drift region that forms a Schottky junction with the drift region.

12. The electronic device of claim 11, further comprising a metal layer on the contact.

13. The electronic device of claim 12, wherein the metal layer is Ti and/or TiW.

14. The electronic device of claim 1, wherein the electronic device is a junction barrier Schottky (JBS) diode.

15. An electronic device that comprising:
a semiconductor device comprising:
a drift region having a first conductivity type; and
a grid comprising a plurality of doped regions formed in the drift region and having a second conductivity type;
wherein the semiconductor device is configured to switch a voltage between 6000 volts and 8000 volts and has a switching loss less than 450 µJ responsive to a pulse voltage between 6000 volts and 8000 volts.

16. The electronic device of claim 15, wherein the semiconductor device is configured to switch the voltage between 6500 volts and 7500 volts and has a switching loss less than 400 µJ.

17. The electronic device of claim 15, wherein the semiconductor device is configured to switch the voltage between 6000 volts and 7000 volts and has a switching loss less than 300 µJ.

18. The electronic device of claim 15, wherein the semiconductor device is a junction barrier Schottky (JBS) diode and wherein the switching loss is not associated with diode junction capacitance.

19. The electronic device of claim 15, wherein the voltage is switched at a rate of approximately 150 kV/µsec.

20. An electronic device comprising:
a semiconductor device comprising:
a drift region having a first conductivity type; and
a grid comprising a plurality of doped regions formed in the drift region and having a second conductivity type;
wherein the semiconductor device is configured to switch a voltage between 6000 volts and 8000 volts and has a charge loss less than 120 nC responsive to a pulse voltage between 6000 volts and 8000 volts.

21. The electronic device of claim 20, wherein the semiconductor device is configured to switch the voltage between 6500 volts and 8000 volts and has a charge loss less than 160 nC.

22. The electronic device of claim 20, wherein the semiconductor device is configured to switch the voltage between 7000 volts and 8000 volts and has a charge loss less than 230 nC.

23. The electronic device of claim 20, wherein the semiconductor device is a junction barrier Schottky (JBS) diode and wherein the charge loss is not associated with diode junction capacitance.

24. The electronic device of claim 20, wherein the voltage is switched at a rate of approximately 150 kV/µsec.

* * * * *

UNITED STATES PATENT AND TRADEMARK OFFICE
CERTIFICATE OF CORRECTION

PATENT NO. : 10,181,532 B2
APPLICATION NO. : 13/835342
DATED : January 15, 2019
INVENTOR(S) : Das et al.

Page 1 of 1

It is certified that error appears in the above-identified patent and that said Letters Patent is hereby corrected as shown below:

In the Claims

Column 9, Line 34, Claim 15: Please correct "device that comprising" to read -- device comprising --

Signed and Sealed this
Twenty-sixth Day of November, 2019

Andrei Iancu
*Director of the United States Patent and Trademark Office*